(12) United States Patent
Ogilvie et al.

(10) Patent No.: US 7,480,888 B1
(45) Date of Patent: Jan. 20, 2009

(54) DESIGN STRUCTURE FOR FACILITATING ENGINEERING CHANGES IN INTEGRATED CIRCUITS

(75) Inventors: Clarence Rosser Ogilvie, Huntington, VT (US); Charles B. Winn, Colchester, VT (US); David Wills Milton, Underhill, VT (US); Kenneth Anthony Lauricella, Colchester, VT (US); Nitin Sharma, South Burlington, VT (US); Paul Mark Schanely, Essex Junction, VT (US); Robert Dov Herzl, South Burlington, VT (US); Robert Spencer Horton, Colchester, VT (US); Tad Jeffrey Wilder, South Hero, VT (US); Douglas P. Nadeau, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/124,771

(22) Filed: May 21, 2008

(51) Int. Cl.
*G06F 17/50* (2006.01)
(52) U.S. Cl. .................. 716/14; 716/1; 716/14; 716/18; 716/19
(58) Field of Classification Search .............. 716/1, 716/14, 18, 19
See application file for complete search history.

(56) References Cited

U.S. PATENT DOCUMENTS 5,696,943 A  12/1997  Lee
5,937,202 A *  8/1999  Crosetto ................ 712/19
5,959,905 A   9/1999  Payne
6,075,381 A   6/2000  LaBerge
6,255,845 B1  7/2001  Wong et al.
6,480,990 B1  11/2002 Sharp et al.
6,650,139 B1  11/2003 Giles
7,034,384 B2  4/2006  Tsai
7,222,325 B2  5/2007  LaBerge
2007/0166842 A1* 7/2007 Yu et al. ................ 438/4

* cited by examiner

*Primary Examiner*—Thuan Do
(74) *Attorney, Agent, or Firm*—Nelson and Nelson; Daniel P. Nelson; Alexis V. Nelson

(57) ABSTRACT

A design structure embodied in a machine-readable medium is disclosed in one embodiment of the invention as including a flexible logic block to facilitate engineering changes at selected locations within an IC. The flexible logic block has a consistent and identifiable structure such that a simple automated process may be used to reconfigure the structure to perform different logical operations. In certain embodiments, the flexible logic block includes a circuit, such as a multiplexer, having multiple inputs and at least one output. A metal interconnect structure is coupled to the inputs and enables connection of each of the inputs to one of several electrical potentials using a focused-ion-beam (FIB) tool. In this way, the circuit may be configured to perform different logical operations after components in the IC exist in hardware.

3 Claims, 5 Drawing Sheets

US 7,480,888 B1

DESIGN STRUCTURE FOR FACILITATING ENGINEERING CHANGES IN INTEGRATED CIRCUITS

BACKGROUND

1. Field of the Invention

This invention relates to design structures for integrated circuits, and more particularly to design structures for facilitating engineering changes in integrated circuits.

2. Description of the Related Art

Continuing improvements in integrated circuit (IC) technology have enabled the development of increasingly complex logic circuitry on smaller and smaller areas of silicon. This has led to rapid increases in IC function and immense improvements in performance. In general, the fabrication of complex ICs involves forming components such as transistors, capacitors, or the like on a silicon substrate. Metal layers may then be applied to the substrate to create conductive interconnections between the components. The placement and routing of these components and interconnections is typically a time-consuming and laborious process that may take weeks or even months to complete.

When designing large ICs (e.g., ASICs), engineering change orders (ECOs) are often performed to make small logic or circuit modifications to already completed (or almost completed) IC designs. Because the placement and routing of IC components and interconnections in such designs is usually very dense and congested (to achieve small IC size), implementing these ECOs can be a time-consuming and problematic process. From distilling down the minimal change in a netlist (when the change was made to RTL) to rewiring gates on an existing placement, such modifications are almost always time-consuming and complicated and do not lend themselves to automation.

In view of the foregoing, what is needed is a method and design structure for simplifying engineering changes to ICs, thereby reducing the cost and time needed to implement such changes. Further needed is a design structure that has a consistent and identifiable structure and is able to provide different logical operations using a simple rewiring process. Further needed is a method and design structure to implement engineering changes in an automated manner.

BRIEF SUMMARY

The invention has been developed in response to the present state of the art and, in particular, in response to the problems and needs in the art that have not yet been fully solved by currently available methods and design structures. Accordingly, the invention has been developed to provide improved methods and design structures for facilitating engineering changes in ICs. The features and advantages of the invention will become more fully apparent from the following description and appended claims, or may be learned by practice of the invention as set forth hereinafter.

Consistent with the foregoing, a design structure embodied in a machine-readable medium is disclosed in one embodiment of the invention as including a flexible logic block to facilitate engineering changes at selected locations within an IC. The flexible logic block has a consistent and identifiable structure such that a simple automated process may be used to reconfigure the structure to perform different logical operations. In certain embodiments, the flexible logic block includes a circuit, such as a multiplexer, having multiple inputs, multiple select lines, and at least one output. A metal interconnect structure is coupled to the inputs and enables connection of each of the inputs to one of several electrical potentials using a focused-ion-beam (FIB) tool. In this way, the flexible logic block may be configured to perform different logical operations after components in the IC are embodied in physical hardware. In selected embodiments, the design structure further includes a marker to easily identify and locate the metal interconnect structure within the IC in order to make the desired engineering changes.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
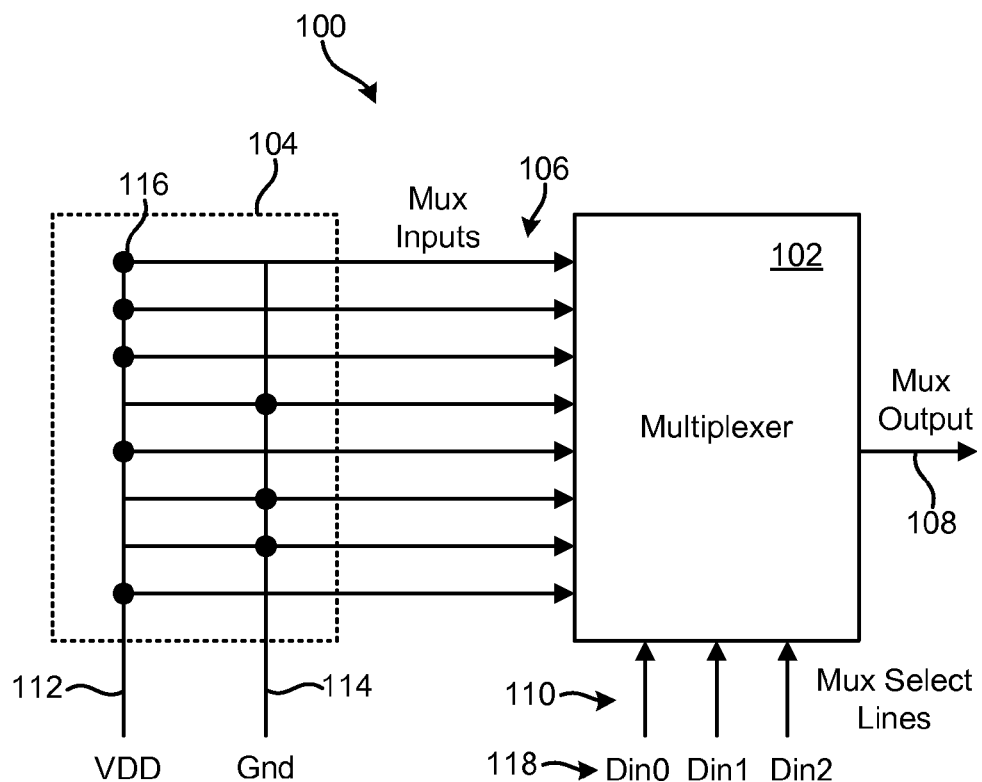
FIG. 1 is a high-level block diagram of one embodiment of a flexible logic block in accordance with the invention.

Referring to FIG. 1, one embodiment of a flexible logic block 100 for facilitating engineering changes or prototype debug work in ICs is illustrated. The flexible logic block 100 may be used to implement combinatorial logic in areas of an IC that have not been tested extensively, are new, or may frequently require engineering changes. As will be explained in more detail hereafter, the flexible logic blocks 100 may be easily reprogrammed using, for example, a FIB tool. This eliminates or reduces the need to replace or reroute IC components or wiring when performing engineering changes. Because of the consistent identifiable design of the flexible logic block 100, changes to the IC may be made using a predictable series of FIB operations, which may be automated, saving both time and costs.

In selected embodiments, a flexible logic block 100 in accordance with the invention includes a circuit 102, in this example a multiplexer 102, coupled to a metal interconnect structure 104 having a consistent and identifiable structure. For example, a multiplexer 102 may include multiple inputs 106, one or more outputs 108, and one or more select lines 110. The number of inputs 106, outputs 108, and select lines 110 is provided only by way of example and is not intended to be limiting.

As will be explained in more detail hereafter, the metal interconnect structure 104 allows the multiplexer inputs 106 to be easily tied to one of several electrical potentials. For example, in the illustrated embodiment, the metal interconnect structure 104 may tie the inputs 106 to either power 112 (VDD 112) or ground 114 (Gnd 114). A black dot 116 indicates that the multiplexer input 106 is coupled to either VDD 112 or ground 114 respectively. In other embodiments, the metal interconnect structure 104 may also be used to tie the inputs 106 to data or logic lines, as will be shown in association with FIG. 2.

In selected embodiments, data or logic signals 118 (e.g., Din0, Din1, Din2) may be routed into the select lines 110 of the multiplexer 102. By selectively connecting the multiplexer inputs 106 to either VDD 112 or ground 114, and routing data or logic signals 118 into the multiplexer select lines 110, a large number of different logical operations or logic gates may be implemented. In other embodiments, circuits 102 other than multiplexers 102 may be used to implement different types of combinatorial logic by connecting various inputs to ground, VDD, logic lines, or the like.

In the illustrated embodiment, a multiplexer 102 that includes three multiplexer select lines 110 may be used to perform various logical operations having three or fewer inputs, such as AND gates, OR gates, NAND gates, NOR gates, XOR gates, adders, or the like, to name just a few. In certain embodiments, several flexible logic blocks 100 may be cascaded or connected together (e.g., by routing multiplexer outputs 108 into select lines 110 of other flexible logic blocks 100) to create different types of combinatorial logic that may not be possible using a single flexible logic block 100.

Thus, a flexible logic block 100 comprising a multiplexer 102 configured in the illustrated manner is very flexible in the types of combinatorial logic it can provide. This eliminates or reduces the need to provide different types and numbers of "spare gates" or other spare logic devices to implement engineering changes, as is disclosed in the prior art. Changes to the flexible logic block 100 are also far less disruptive to the IC's timing since changes occur within the flexible logic block 100 and do not involve incorporation of additional spare gates or components into the IC design.

Figure 2:
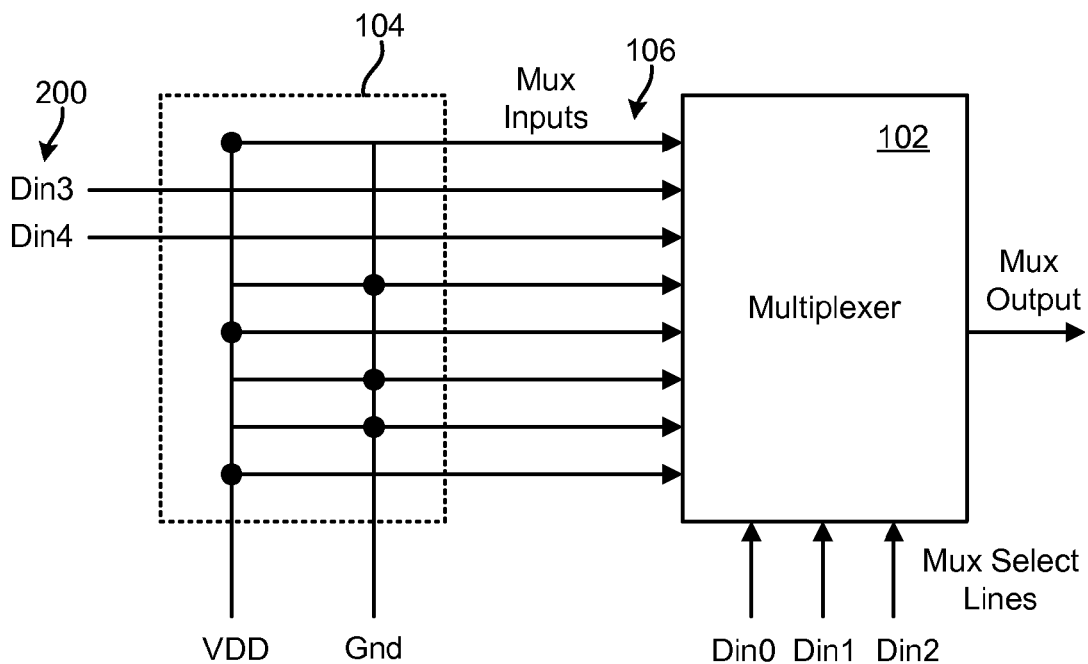
FIG. 2 is a high-level block diagram of another embodiment of a flexible logic block in accordance with the invention.

Referring to FIG. 2, as previously mentioned, the metal interconnect structure 104 may, in certain embodiments, allow one or more data or logic signals to be coupled to the multiplexer inputs 106. For example, data or logic signals 200 (i.e., Din3, Din4) are routed into two multiplexer inputs 106 in the illustrated embodiment. This feature may provide additional flexibility and allow other types of combinatorial logic to be created.

Figure 3:
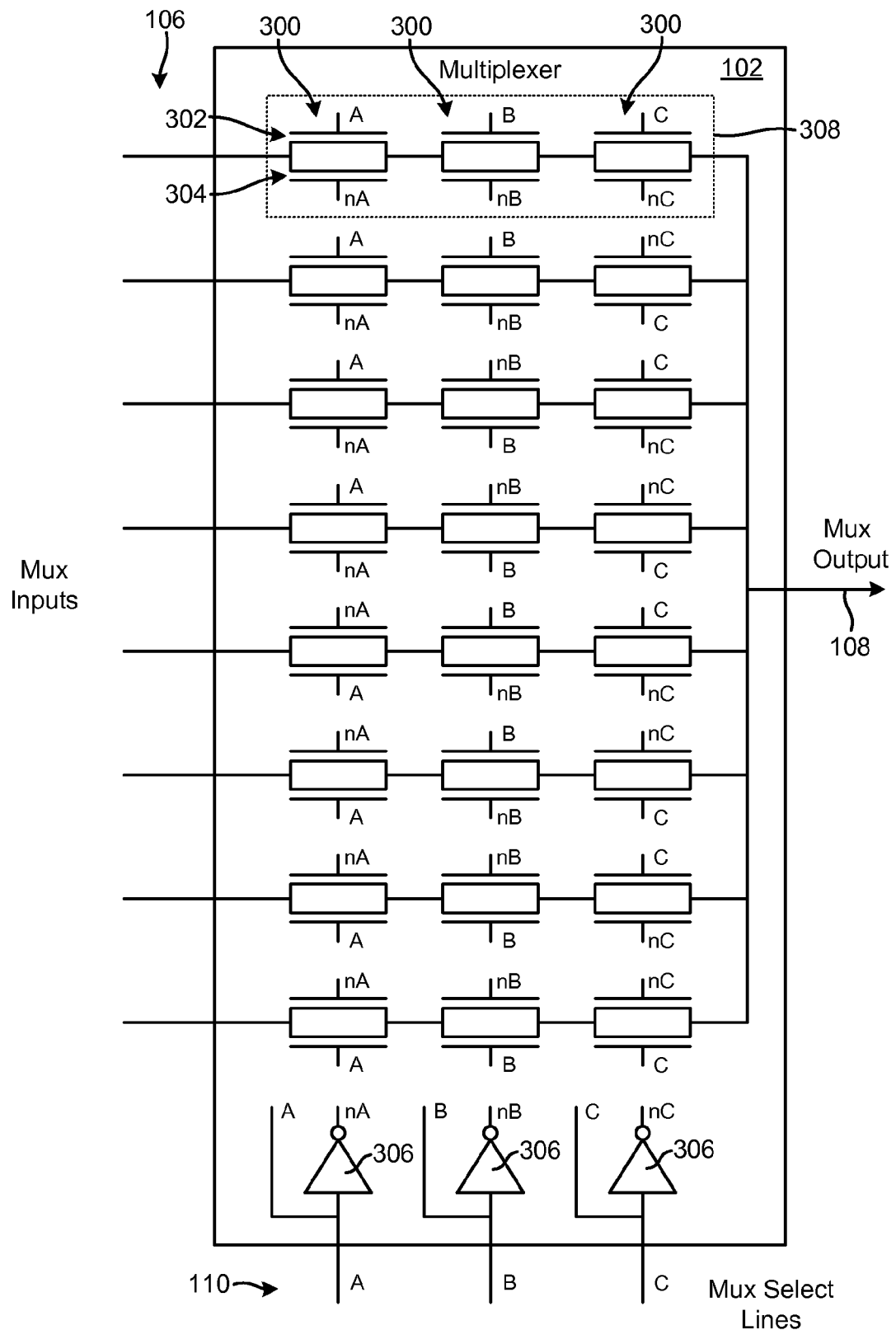
FIG. 3 is a high-level block diagram of one embodiment of a multiplexer for use with the flexible logic block.

Referring to FIG. 3, in selected embodiments, a multiplexer 102 in accordance with the invention may be implemented using an array of transmission gates 300. In this embodiment, the multiplexer 102 includes three multiplexer select lines 110 ("A," "B," and "C") and inversions ("nA," "nB," and "nC") of the multiplexer select lines 110. Invertors 306 may be used to generate the inversions. The multiplexer 102 may also include eight circuit blocks 308, each containing three transmission gates 300 connected in series. Each of the circuit blocks 308 may connect or disconnect a multiplexer input 106 to or from the multiplexer output 108. The transmission gates 300 may each include an N-type device 302 and a P-type device 304 connected in parallel. The inputs to the transmission gates 300 may be connected to the multiplexer select lines 110 and inversions of the multiplexer select lines 110, as labeled, to achieve a 3-to-8 decode.

The multiplexer 102 is not limited to the illustrated embodiment but may include other multiplexer designs know to those of skill in the art. For example, in certain embodiments, the transmission gates 300 may be replaced with pass gates or other logic gates to achieve a similar result. Because the multiplexer 102 may include a significant number of logic gates, the flexible logic block 100 may be used sparingly in the IC design. That is, the flexible logic block 100 may be reserved for areas of an IC that have risky or error-prone logic, have not been tested extensively, require frequent engineering changes, require prototype debug work, or the like, in order to keep the IC as compact as possible.

Figure 4:
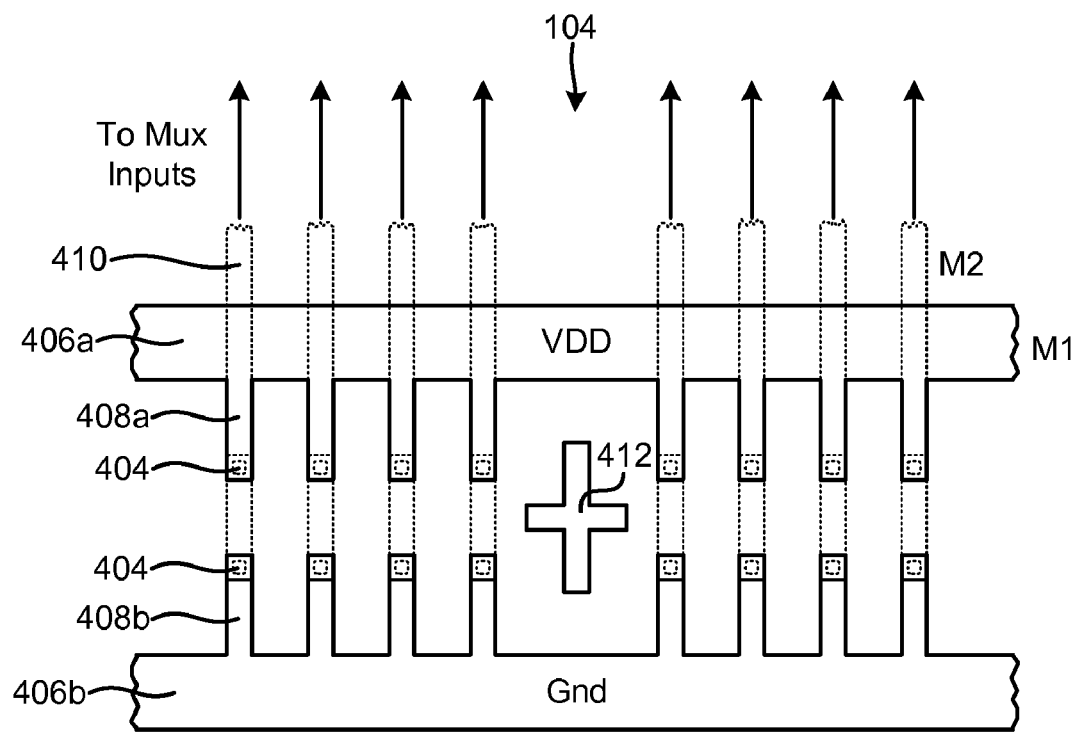
FIG. 4 is a high-level diagram of one embodiment of a metal interconnect structure for use with the flexible logic block.

Referring to FIG. 4, one embodiment of the physical layout of a metal interconnect structure 104 is illustrated. As previously described, the metal interconnect structure 104 may enable multiplexer inputs 106 to be tied to one of several electrical potentials. Such a structure 104 or block 104 may be placed in the physical design of an IC. In the illustrated embodiment, solid lines are used to represent conductive wires or traces in a first metal layer (M1) and dotted lines are used to represent conductive wires or traces in a second metal layer (M2) adjacent to the first metal layer. Shapes 404 represent the locations of vias or potential vias connecting the conductive wires or traces in the first and second metal layers.

As illustrated, in this embodiment of a metal interconnect structure 104, the first metal layer may include metal traces 406a, 406b connected to VDD or ground with metal tabs 408a, 408b extending therefrom. One of these metal tabs 408a, 408b may be coupled to a metal trace 410 (coupled to a multiplexer input line 106) using a via 404 to provide a connection to either VDD or ground. In this way, each of the multiplexer input lines 106 may be connected to either VDD or ground.

Figure 6A:
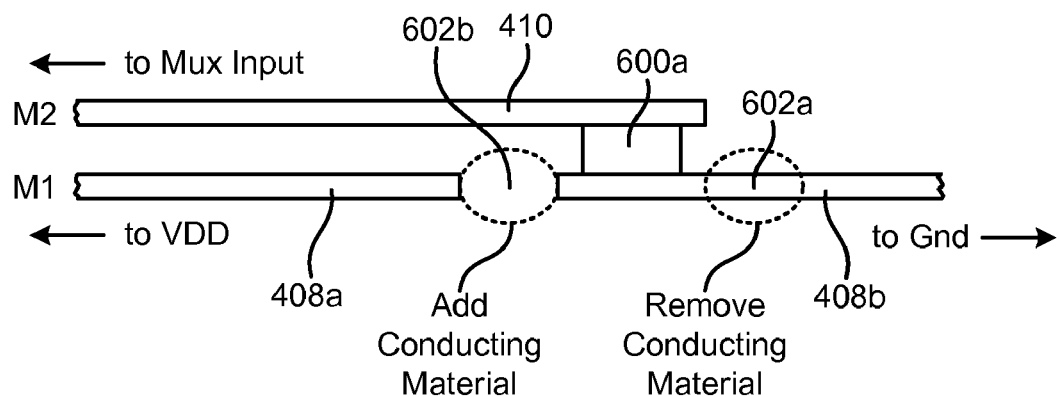
FIG. 6A is a side profile of the interconnect structure of FIG. 4 showing one technique for altering the metal interconnect structure with a FIB tool.
Figure 6B:
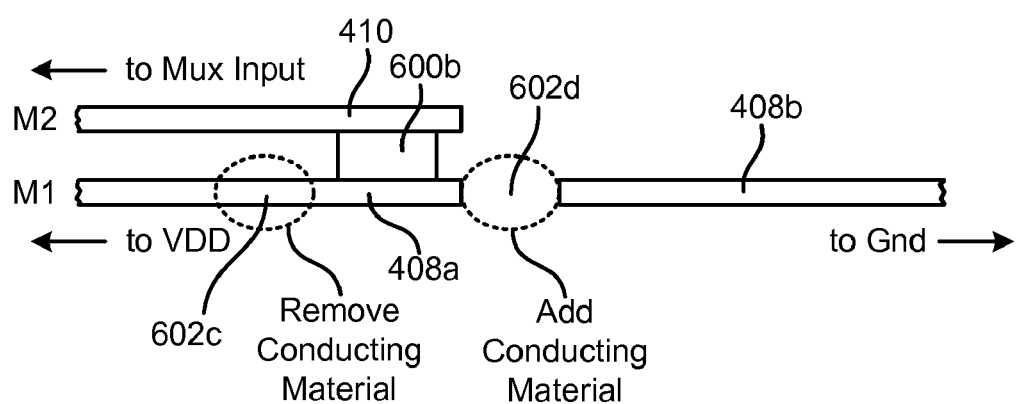
FIG. 6B is a side profile of the interconnect structure of FIG. 4 showing another technique for altering the metal interconnect structure with a FIB tool.

The consistent and identifiable shape of the structure 104 or block 104 facilitates reprogramming of the flexible logic block 100 with tools such as a FIB tool on a single or minimal number of metal levels, as will be shown in more detail in FIGS. 6A and 6B. The structure 104 also allows changes to be made easily with a mask if done on a production scale. The consistent and identifiable shape of the structure 104 allows it to be easily located and allows any changes thereto to be automated.

In selected embodiments in accordance with the invention, a marker 412 or label 412, such as the illustrated alignment cross 412, may be placed within or near the structure 104. Such a marker 412 may be helpful to identify and locate the structure 104 when performing engineering changes or prototype debug work, particularly when using a tool such as a FIB tool to implement the changes. This also facilitates performing edits from the back side of the IC, assuming transistors or other components are not placed between the metal interconnect structure 104 and the back side of the IC. In certain embodiments, the metal interconnect structure 104 may be placed in the lower metal layers of the IC to facilitate back-side access and prevent reductions in chip wireability.

Figure 5:
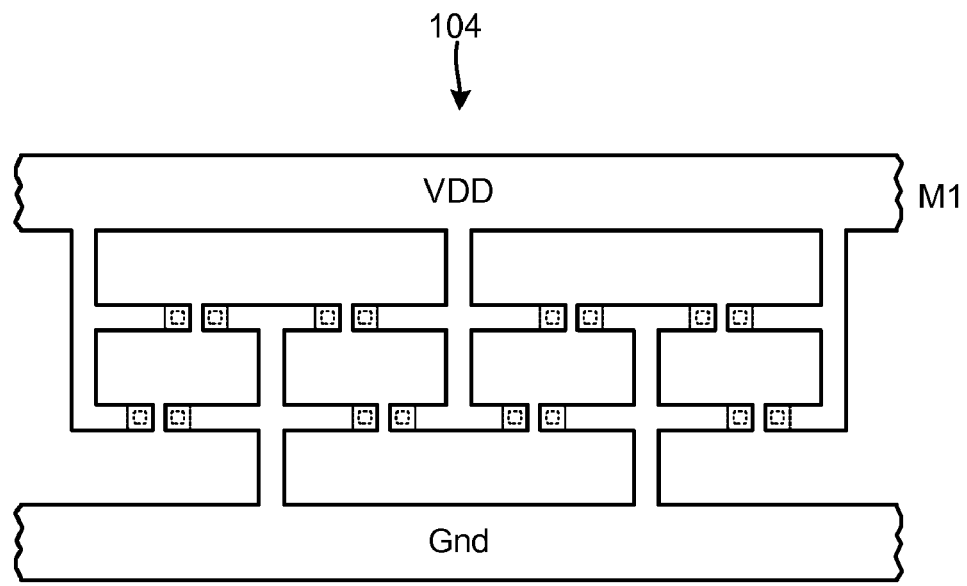
FIG. 5 is a high-level diagram of another embodiment of a metal interconnect structure for use with the flexible logic block.

The metal interconnect structure 104 illustrated in FIG. 4 represents just one example of a metal interconnect structure 104 in accordance with the invention. Indeed, the structure 104 could be designed to have a wide variety of shapes, sizes, and configurations. For example, FIG. 5 shows an alternative embodiment of the M1 layer of a metal interconnect structure 104. Although ideally placed in lower level metal layers of the IC, the interconnect structures 104 illustrated herein may be placed in any suitable metal layer(s) and may be configured for either back-side or front-side access on the IC.

Referring to FIG. 6A, in certain embodiments, reconfiguring the flexible logic block 100 may be as simple as removing or adding metal to or from different portions of the metal interconnect structure 104. FIG. 6A shows one technique for altering the metal interconnect structure 104 with a FIB tool on a single metal layer. For example, if a metal trace 410 (connected to a multiplexer input 106) is originally coupled to ground using a via 600a, the metal trace 410 may be disconnected from ground and connected to VDD by removing metal from a location 602a and adding metal to a location 602b. The short distances for adding or removing conductive material facilitates use of the FIB tool. Similarly, referring to FIG. 6B, if a metal trace 410 is originally coupled to VDD using a via 600b, the metal trace 410 may be disconnected from VDD and connected to ground by removing metal from a location 602c and adding metal to a location 602d.

Figure 7:
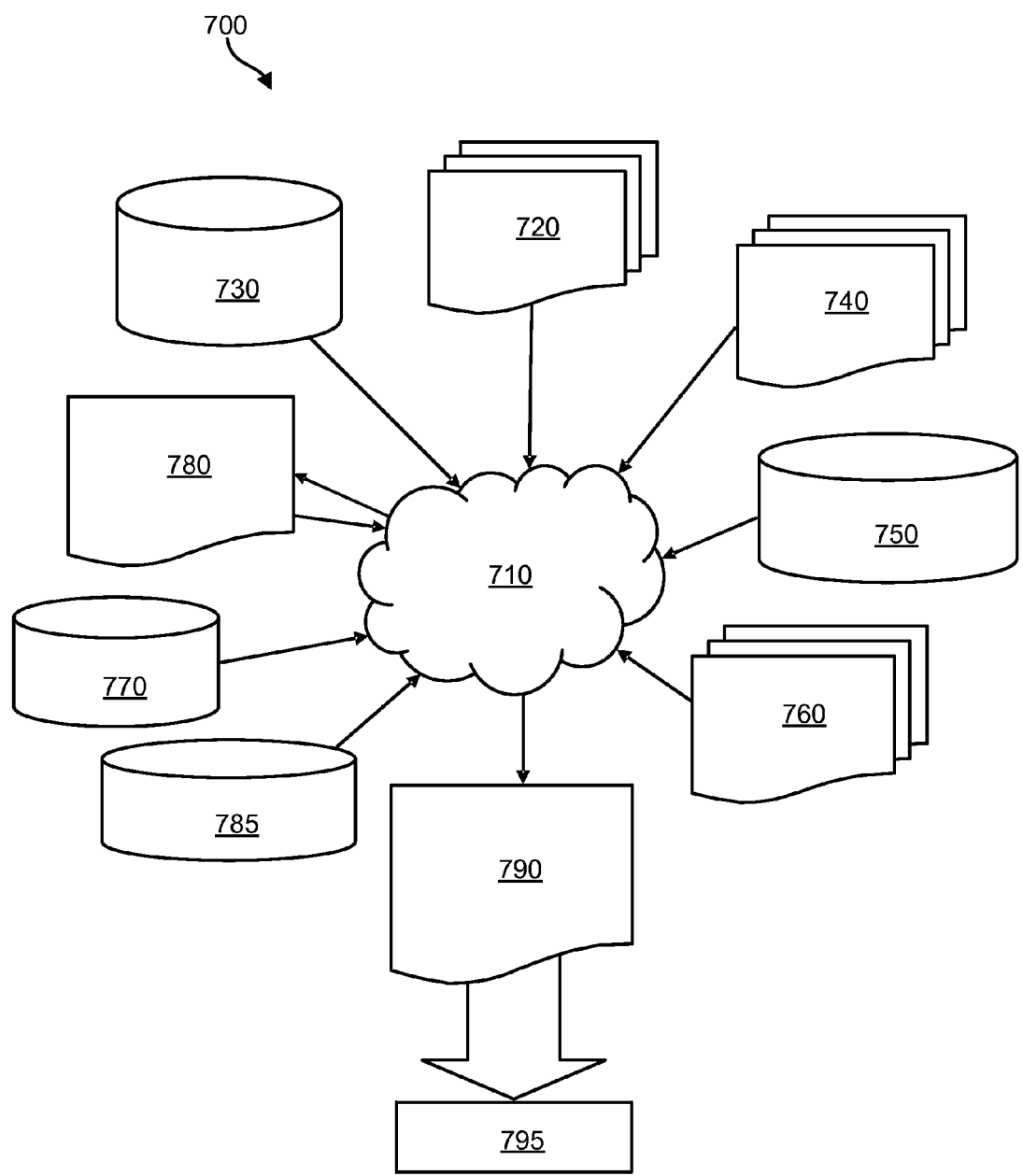
FIG. 7 is a flow diagram of a design process used in semiconductor design, manufacture, and/or test.

FIG. 7 shows a block diagram of an exemplary design flow 700 used, for example, in semiconductor design, manufacturing, and/or test. Design flow 700 may vary depending on the type of IC being designed. For example, a design flow 700 for building an application specific IC (ASIC) may differ from a design flow 700 for designing a standard component. Design structure 720 is preferably an input to a design process 710 and may come from an IP provider, a core developer, or other design company or may be generated by the operator of the design flow, or from other sources. Design structure 720 may include an embodiment of the invention as shown in FIGS. 1 through 5 in the form of schematics or HDL, a hardware-description language (e.g., Verilog, VHDL, C, etc.). Design structure 720 may be contained or stored on one or more machine-readable medium.

For example, design structure 720 may be a text file or a graphical representation of an embodiment of the invention as shown in FIGS. 1 through 5. Design process 710 preferably synthesizes (or translates) an embodiment of the invention as shown in FIG. 1 through 5 into a netlist 780, where netlist 780 is, for example, a list of wires, transistors, logic gates, control circuits, I/O, models, or the like that describes the connections to other elements and circuits in an IC design and is recorded on at least one machine-readable medium. For example, the medium may be a CD, a compact flash, other flash memory, a packet of data to be sent via the Internet, or other networking suitable means. The synthesis may be an iterative process in which netlist 780 is resynthesized one or more times depending on design specifications and parameters for the circuit.

Design process 710 may include using a variety of inputs; for example, inputs from library elements 730 which may house a set of commonly used elements, circuits, and devices, including models, layouts, and symbolic representations for a given manufacturing technology (e.g., different technology nodes, 32 nm, 45 nm, 90 nm, etc.), design specifications 740, characterization data 750, verification data 760, design rules 770, and test data files 785 (which may include test patterns and other testing information). Design process 710 may further include, for example, standard circuit design processes such as timing analysis, verification, design rule checking, place and route operations, or the like. One of ordinary skill in the art of IC design can appreciate the extent of possible electronic design automation tools and applications used in design process 710 without deviating from the scope and spirit of the invention. The design structure of the invention is not limited to any specific design flow.

Design process 710 may translate an embodiment of the invention as shown in FIGS. 1 through 5, along with any additional IC design or data (if applicable), into a second design structure 790. Design structure 790 may reside on a storage medium in a data format used for the exchange of layout data of ICs and/or symbolic data format (e.g. information stored in a GDSII (GDS2), GL1, OASIS, map files, or any other suitable format for storing such design structures). Design structure 790 may include information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1 through 5. Design structure 790 may then proceed to a stage 795 where, for example, design structure 790 proceeds to tape-out, is released to manufacturing, is released to a mask house, is sent to another design house, is sent back to the customer, or the like.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A design structure embodied in a machine-readable medium, the design structure comprising:
    a flexible logic block to facilitate engineering changes at selected locations within an integrated circuit, the flexible logic block capable of performing different logical operations, the flexible logic block comprising:
        a circuit comprising a plurality of inputs and at least one output; and
        a metal interconnect structure coupled to the plurality of inputs and enabling connection of each of the plurality of inputs to one of several electrical potentials using a focused-ion-beam tool, thereby enabling the circuit to perform different logical operations.

2. The design structure of claim 1, further comprising a marker to aid in identifying and locating the metal interconnect structure within the integrated circuit.

3. The design structure of claim 1, wherein the circuit is a multiplexer.

* * * * *